United States Patent
Anac et al.

(10) Patent No.: US 11,047,685 B2
(45) Date of Patent: *Jun. 29, 2021

(54) CONFIGURATION TO REDUCE NON-LINEAR MOTION

(71) Applicant: INVENSENSE, INC., San Jose, CA (US)

(72) Inventors: Ozan Anac, Oakland, CA (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/735,351

(22) Filed: Jan. 6, 2020

(65) Prior Publication Data

US 2020/0225038 A1 Jul. 16, 2020

Related U.S. Application Data

(63) Continuation of application No. 15/814,373, filed on Nov. 15, 2017, now Pat. No. 10,527,421, which is a
(Continued)

(51) Int. Cl.
*G01C 19/5762* (2012.01)
*G01C 19/5733* (2012.01)
(Continued)

(52) U.S. Cl.
CPC ........ *G01C 19/5762* (2013.01); *B81B 3/0051* (2013.01); *G01C 19/5733* (2013.01);
(Continued)

(58) Field of Classification Search
CPC ............ G01C 19/5733; G01C 19/5747; G01C 19/5762; G01P 15/0802; B81B 3/0051
See application file for complete search history.

(56) References Cited

U.S. PATENT DOCUMENTS

| 4,510,802 A | 4/1985 | Peters |
| 5,349,855 A | 9/1994 | Bernstein et al. |

(Continued)

FOREIGN PATENT DOCUMENTS

| CN | 1782713 A | 6/2006 |
| CN | 1867832 A | 11/2006 |

(Continued)

OTHER PUBLICATIONS

Notification of Reason for Refusal received for Korean Patent Application Serial No. 10-2015-0009691 dated Feb. 8, 2017, 12 pages.
(Continued)

*Primary Examiner* — Helen C Kwok
(74) *Attorney, Agent, or Firm* — Amin, Turocy & Watson, LLP

(57) ABSTRACT

Embodiments for modifying a spring mass configuration are disclosed that minimize the effects of unwanted nonlinear motion on a MEMS sensor. The modifications include any or any combination of providing a rigid element between rotating structures of the spring mass configuration, tuning a spring system between the rotating structures and coupling an electrical cancellation system to the rotating structures. In so doing unwanted nonlinear motion such as unwanted $2^{nd}$ harmonic motion is minimized.

15 Claims, 7 Drawing Sheets

Related U.S. Application Data continuation of application No. 14/495,786, filed on Sep. 24, 2014, now Pat. No. 9,958,271.

(60) Provisional application No. 61/929,838, filed on Jan. 21, 2014.

(51) Int. Cl.
*G01C 19/5747* (2012.01)
*G01P 15/08* (2006.01)
*B81B 3/00* (2006.01)

(52) U.S. Cl.
CPC ...... *G01C 19/5747* (2013.01); *G01P 15/0802* (2013.01); *B81B 2201/0242* (2013.01); *B81B 2203/0163* (2013.01)

(56) References Cited

U.S. PATENT DOCUMENTS

| | | | |
|---|---|---|---|
| 5,481,914 A | 1/1996 | Ward | |
| 5,895,850 A | 4/1999 | Buestgens | |
| 5,992,233 A | 11/1999 | Clark | |
| 6,067,858 A | 5/2000 | Clark et al. | |
| 6,230,563 B1 | 5/2001 | Clark et al. | |
| 6,250,156 B1 | 6/2001 | Seshia et al. | |
| 6,508,122 B1 | 1/2003 | McCall et al. | |
| 6,520,017 B1 | 2/2003 | Schoefthaler et al. | |
| 6,845,669 B2 | 1/2005 | Acar et al. | |
| 6,892,575 B2 | 5/2005 | Nasiri et al. | |
| 6,939,473 B2 | 9/2005 | Nasiri et al. | |
| 7,036,372 B2 | 5/2006 | Chojnacki et al. | |
| 7,250,112 B2 | 7/2007 | Nasiri et al. | |
| 7,284,430 B2 | 10/2007 | Acar et al. | |
| 7,437,933 B2 | 10/2008 | Durante et al. | |
| 7,458,263 B2 | 12/2008 | Nasiri et al. | |
| 8,042,394 B2 | 10/2011 | Coronato et al. | |
| 8,042,396 B2 | 10/2011 | Coronato et al. | |
| 8,069,726 B2 | 12/2011 | Seeger et al. | |
| 8,141,424 B2 | 3/2012 | Seeger et al. | |
| 8,322,213 B2 | 12/2012 | Trusov et al. | |
| 8,539,835 B2 | 9/2013 | Seeger et al. | |
| 8,833,162 B2 | 9/2014 | Seeger et al. | |
| 9,097,524 B2 | 8/2015 | Seeger et al. | |
| 9,170,107 B2 | 10/2015 | Anac et al. | |
| 9,395,183 B2 | 7/2016 | Seeger et al. | |
| 9,958,271 B2 * | 5/2018 | Anac | G01C 19/5733 |
| 10,527,421 B2 * | 1/2020 | Anac | G01C 19/5747 |
| 2003/0200804 A1 | 10/2003 | Johnson | |
| 2003/0200807 A1 | 10/2003 | Hulsing, II | |
| 2004/0211258 A1 | 10/2004 | Geen | |
| 2005/0066728 A1 | 3/2005 | Chojnacki et al. | |
| 2005/0072231 A1 | 4/2005 | Chojnacki | |
| 2005/0081631 A1 | 4/2005 | Weinberg et al. | |
| 2005/0081633 A1 | 4/2005 | Nasid et al. | |
| 2005/0199061 A1 | 9/2005 | Acar et al. | |
| 2006/0070441 A1 | 4/2006 | Durante et al. | |
| 2006/0112764 A1 | 6/2006 | Higuchi | |
| 2006/0219006 A1 | 10/2006 | Nasiri et al. | |
| 2007/0214883 A1 | 9/2007 | Durante et al. | |
| 2007/0234803 A1 | 10/2007 | Gomez et al. | |
| 2007/0240508 A1 | 10/2007 | Watson | |
| 2008/0000296 A1 | 1/2008 | Johnson | |
| 2008/0115579 A1 | 5/2008 | Seeger et al. | |
| 2009/0019933 A1 | 1/2009 | Sung et al. | |
| 2009/0064780 A1 | 3/2009 | Coronato et al. | |
| 2009/0114016 A1 | 5/2009 | Nasiri | |
| 2009/0193892 A1 | 8/2009 | Seeger | |
| 2009/0260437 A1 | 10/2009 | Blomqvist | |
| 2010/0064805 A1 | 3/2010 | Seeger et al. | |
| 2010/0071467 A1 | 3/2010 | Nasiri et al. | |
| 2010/0199764 A1 | 8/2010 | Hammer | |
| 2010/0218605 A1 | 9/2010 | Blomqvist et al. | |
| 2010/0222998 A1 | 9/2010 | Blomqvist | |
| 2010/0251800 A1 | 10/2010 | Mueck | |
| 2010/0313657 A1 | 12/2010 | Trusov et al. | |
| 2011/0061460 A1 | 3/2011 | Seeger et al. | |
| 2012/0216612 A1 | 8/2012 | Seeger et al. | |
| 2012/0222483 A1 | 9/2012 | Blomqvist et al. | |
| 2012/0272711 A1 | 11/2012 | Supino et al. | |
| 2012/0291548 A1 | 11/2012 | Kanemoto | |
| 2013/0019680 A1 | 1/2013 | Kittilsland et al. | |
| 2013/0068018 A1 | 3/2013 | Seeger et al. | |
| 2013/0086985 A1 | 4/2013 | Lin | |
| 2013/0192365 A1 | 8/2013 | Zhuang et al. | |
| 2013/0233048 A1 | 9/2013 | Anac et al. | |
| 2013/0239686 A1 | 9/2013 | Cazzaniga et al. | |
| 2017/0023363 A1 | 1/2017 | Cazzaniga et al. | |

FOREIGN PATENT DOCUMENTS

| | | |
|---|---|---|
| CN | 101663586 A | 3/2010 |
| CN | 101855516 A | 10/2010 |
| CN | 101987718 A | 3/2011 |
| CN | 102947674 A | 2/2013 |
| CN | 103033177 A | 4/2013 |
| CN | 103076012 A | 5/2013 |
| CN | 103245340 A | 8/2013 |
| CN | 103492836 A | 1/2014 |
| CN | 103797331 A | 5/2014 |
| EP | 1 568 968 A2 | 8/2005 |
| EP | 1978331 A2 | 10/2008 |
| EP | 2 570 770 A2 | 3/2013 |
| EP | 2 899 503 A1 | 7/2015 |
| GB | 2 302 177 A | 1/1997 |
| KR | 100374431 B1 | 5/2003 |
| KR | 10-2013-0084950 A | 7/2013 |
| WO | 2009/130554 A2 | 10/2009 |

OTHER PUBLICATIONS

First Office Action received for Chinese Patent Application Serial No. 201510030426.6 dated May 2, 2017, 15 pages.

Non-Final Office Action received for U.S. Appl. No. 14/495,786 dated Mar. 3, 2017, 18 pages.

International Search Report and Written Opinion received for PCT Application Serial No. PCT/US2012/054411 dated Dec. 24, 2012, 9 pages.

Non-Final Office Action received for U.S. Appl. No. 13/235,296 dated Dec. 26, 2013, 38 pages.

Notice of Allowance received for U.S. Appl. No. 13/235,296 dated May 9, 2014, 21 pages.

Non-Final Office Action received for U.S. Appl. No. 13/862,352 dated May 10, 2016, 25 pages.

Notice of Allowance received for U.S. Appl. No. 14/041,810 dated Apr. 20, 2015, 37 pages.

Notice of Allowance received for U.S. Appl. No. 14/041,810 dated Jun. 24, 2015, 27 pages.

Non-Final Office Action received for U.S. Appl. No. 14/472,143 dated Apr. 20, 2015, 41 pages.

Notice of Allowance received for U.S. Appl. No. 14/472,143 dated Nov. 12, 2015, 27 pages.

Notice of Allowance received for U.S. Appl. No. 14/472,143 dated Dec. 18, 2015, 19 pages.

Communication pursuant to Article 94(3) EPC received for EP Patent Application Serial No. 12832613.9 dated Dec. 10, 2015, 2 pages.

Extended European Search Report received for EP Patent Application Serial No. 12832613.9 dated Feb. 2, 2015, 6 pages.

Partial European Search Report received for European Patent Application No. 15167772 dated Oct. 26, 2015, 7 pages.

Extended European Search Report received for EP Patent Application Serial No. 15167772.1 dated Feb. 11, 2016, 15 pages.

Notice of Allowance received for U.S. Appl. No. 14/472,143 dated Mar. 28, 2016, 29 pages.

Extended European Search Report received for EP Patent Application Serial No. 15152031.9 dated Jun. 25, 2015, 7 pages.

Extended European Search Report received for EP Patent Application Serial No. 17174612.6 dated Oct. 11, 2017, 7 pages.

(56) References Cited

OTHER PUBLICATIONS

Second Office Action received for Chinese Patent Application Serial No. 201510030426.6 dated Mar. 5, 2018, 3 pages.
Notification of Reason for Refusal received for Korean Patent Application Serial No. 10-2014-7009829 dated Apr. 3, 2015, 6 pages.
Non-Final Office Action received for U.S. Appl. No. 15/814,373 dated Apr. 29, 2019, 19 pages.
First Office Action received for Chinese Patent Application Serial No. 201280045067.6 dated Nov. 14, 2014, 28 pages.
Second Office Action received for Chinese Patent Application Serial No. 201280045067.6 dated Jul. 21, 2015, 8 pages.
First Office Action received for Chinese Patent Application Serial No. 201410505767.X dated Dec. 5, 2016, 34 pages.
Second Office Action received for Chinese Patent Application Serial No. 201410505767.X dated Jun. 13, 2017, 23 pages.
Third Office Action received for Chinese Patent Application Serial No. 201410505767.X dated Sep. 29, 2017, 8 pages.
First Office Action received for Chinese Patent Application Serial No. 201510258053.8 dated Aug. 1, 2017, 25 pages.
Second Office Action received for Chinese Patent Application Serial No. 201510258053.8 dated Jul. 17, 2018, 9 pages.
Extended European Search Report received for EP Patent Application Serial No. 14182956.4 dated May 15, 2015, 10 pages.
Communication pursuant to Article 94(3) EPC received for EP Patent Application Serial No. 14182956.4 dated Mar. 15, 2016, 7 pages.
Communication pursuant to Article 94(3) EPC received for EP Patent Application Serial No. 15167772.1 dated May 22, 2018, 7 pages.
Communication pursuant to Article 94(3) EPC received for EP Patent Application Serial No. 15167772.1 dated Apr. 11, 2019, 8 pages.
Extended European Search Report received for EP Patent Application Serial No. 17156131.9 dated Mar. 17, 2017, 8 pages.
Communication pursuant to Article 94(3) EPC received for EP Patent Application Serial No. 17156131.9 dated Nov. 2, 2018, 7 pages.
Communication pursuant to Article 94(3) EPC received for EP Patent Application Serial No. 17174612.6 dated Jun. 11, 2019, 5 pages.
Notification of Reason for Refusal received for Korean Patent Application Serial No. 10-2014-0128112 dated Jan. 28, 2016, 11 pages.
Grant of Patent received for Korean Patent Application Serial No. 10-2014-0128112 dated Oct. 31, 2016, 2 pages.
Notification of Reason for Refusal received for Korean Patent Application Serial No. 10-2015-0070468 dated Mar. 16, 2017, 4 pages.
Grant of Patent received for Korean Patent Application Serial No. 10-2015-0070468 dated Oct. 30, 2017, 2 pages.
International Search Report and Written Opinion received for PCT Application Serial No. PCT/US2018/040822 dated Nov. 21, 2018, 16 pages.
Communication pursuant to Article 94(3) EPC received for EP Patent Application Serial No. 15152031.9 dated May 31, 2019, 8 pages.
Notice of Intent to Grant dated Dec. 13, 2019 for European Application Serial No. 17174612.6, 7 pages.
Notice of Intent to Grant dated Jun. 16, 2020 for European Application Serial No. 15152031.9, 8 pages.
Extended European Search Report dated Mar. 29, 2021 for European Application Serial No. 20209488.4, 12 pages.

\* cited by examiner

CONFIGURATION TO REDUCE NON-LINEAR MOTION

PRIORITY CLAIM

Under 35 U.S.C. 120, this application is a Continuation Application and claims priority to U.S. patent application Ser. No. 15/814,373, filed Nov. 15, 2017, entitled, "CONFIGURATION TO REDUCE NON-LINEAR MOTION," which application is a Continuation Application of U.S. patent application Ser. No. 14/495,786, filed Sep. 24, 2014, entitled, "CONFIGURATION TO REDUCE NON-LINEAR MOTION," which application claims benefit under 35 USC 119(e) of U.S. Provisional Patent Application No. 61/929,838, filed on Jan. 21, 2014, entitled, "PERFORMANCE IMPROVEMENTS ON 3-AXIS FRAME MICRO GYROSCOPES," the entireties of which are incorporated herein by reference.

TECHNICAL FIELD

The present invention relates generally to angular velocity sensors and more particularly relates to angular velocity sensors that include guided mass systems.

BACKGROUND

Sensing of angular velocity is frequently performed using vibratory rate gyroscopes. Vibratory rate gyroscopes broadly function by driving the sensor into a first motion and measuring a second motion of the sensor that is responsive to both the first motion and the angular velocity to be sensed.

Frequently, a mass, usually referred to as a proof mass, within the sensor is driven into oscillation by an actuator. Rotation of the sensor imparts a Coriolis force to the oscillating mass that is proportional to the angular velocity (or rotation rate), and depends on the orientation of the angular velocity vector with respect to the velocity vector of the proof mass. The Coriolis force, the angular velocity vector, and the proof-mass velocity vector are mutually orthogonal. For example, a proof-mass moving in an X-direction within a sensor rotating about a Y-axis experiences a Z directed Coriolis force. Similarly, a proof-mass moving in an X-direction within a sensor rotating about a Z-axis experiences a Y directed Coriolis force. Finally, a proof-mass moving in an X-direction within a sensor rotating about the X-axis experiences no Coriolis force. Coriolis forces imparted to the proof-mass are usually sensed indirectly by measuring motions within the sensor that are responsive to the Coriolis forces.

Conventional gyroscopes that sense angular velocity about an in-plane axis (i.e. X-axis or Y-axis) can be driven out-of-plane, and the Coriolis response is sensed in-plane or vice versa. Out-of-plane drive tends to be less efficient than in-plane drive, requires additional fabrication steps, and is limited by nonlinearities. For example, driving the proof-mass out-of-plane might require a large vertical gap or a cavity underneath the proof-mass to provide sufficient room for the proof-mass to oscillate. Forming a cavity under the proof-mass requires additional fabrication steps and increases cost. Typically electrostatic actuators of the parallel-plate type are used to drive the proof-mass out-of-plane. The actuators are formed between the proof-mass and the substrate. The electrostatic force depends on the gap between the proof-mass and the substrate. Because the proof-mass oscillates out-of-plane, the electrostatic force is nonlinear which tends to limit the device performance Additionally, the electrostatic force is reduced because of the requirement to have large vertical gaps or a cavity under the proof-mass. Achieving large amplitude oscillation requires large force and that might require high-voltage actuation. Adding high-voltage actuation increases the fabrication cost and complexity of the integrated circuits.

Furthermore a conventional multi-axis gyroscope might use multiple structures that oscillate at independent frequencies to sense angular rates. Each structure requires a separate drive circuit to oscillate the respective proof-masses. Having more than one drive circuit increases cost and power consumption.

Accordingly, what is desired is to provide a system and method that overcomes the above issues. The present invention addresses such a need.

SUMMARY

Embodiments for modifying a spring mass configuration are disclosed that minimize the effects of unwanted nonlinear motion on a Micro-Electro-Mechanical Systems (MEMS) sensor. The modifications include any or any combination of providing a rigid element between rotating structures of the spring mass configuration, tuning a spring system between the rotating structures and coupling an electrical cancellation system to the rotating structures. In so doing unwanted nonlinear motion such as unwanted 2 harmonic motion is minimized.

In an aspect, MEMS sensor is disclosed. The MEMS sensor includes a first and second rotating arm. The first and second rotating arms are coupled to each other and the first and second rotating arms are configured to counter rotate when driven into oscillation. The MEMS sensor also includes at least one travelling system. The at least one travelling system is coupled to the first and second rotating arms. Finally, the MEMS sensor includes at least one actuator for driving the at least one travelling system into oscillation. The at least one travelling system moves in a first direction when driven into oscillation.

DETAILED DESCRIPTION

The present invention relates generally to angular velocity sensors and more particularly relates to angular velocity sensors that include guided mass systems. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device may refer to a semiconductor device implemented as a Microelectromechanical system. A MEMS device includes mechanical elements and optionally includes electronics for sensing. MEMS devices include but are not limited to gyroscopes, accelerometers, magnetometers, and pressure sensors.

Figure 1:
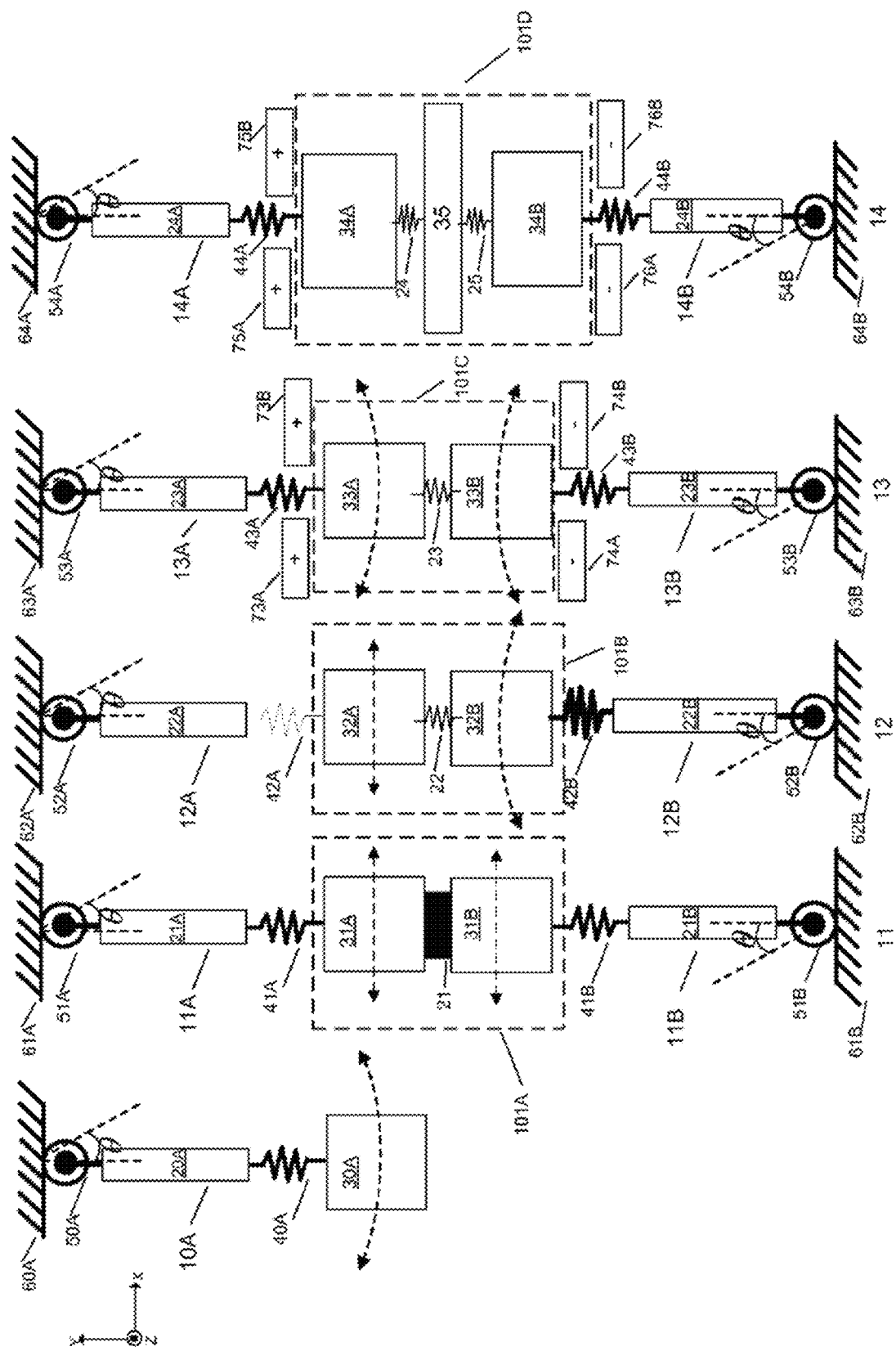
FIG. 1 illustrates four different spring-mass configurations 10, 11, 12 and 13, respectively.

FIG. 1 illustrates four different spring-mass configurations 10, 11, 12 and 13, that could be utilized in a MEMS sensor, respectively. A first spring-mass configuration 10 includes a spring-mass system 10A. The spring mass system 10A includes a lever arm 20A, a proof mass 30A, a linear spring 40A, and a hinge 50A attached to a stable point 60A. The proof mass, 30A, in the spring mass system 10A has three degrees of freedom. The proof mass 30A can rotate by an angle θ about an axis passing from the center of the hinge 50A and normal to a first plane in this embodiment, the XY plane, and it can translate in X and Y direction as it rotates in the X-Y plane. Although it is not shown in FIG. 1 in detail, hinge 50A has a finite translational compliance, and linear spring 40A has a finite rotational compliance. If it is assumed that the length of the spring 40A is negligible and the length of the lever arm 20A is L. The X direction motion of the mass 30A is given by the equation:

$$X_d = L \sin(\theta) \approx L\theta \quad \text{(Eq-1)}$$

where $X_d$ is the x-direction translation motion of the proof mass 30A. Since the motion of the proof mass 30A is rotational, there is also Y direction component of the motion of the proof mass 30A which can be represented as in the equation given below:

$$Y_d = L(1 - \cos(\theta)) \approx L\frac{\theta^2}{2} \quad \text{(Eq-2)}$$

where $Y_d$ is the Y-direction translation motion of the proof-mass.

If the mass 30A is driven at a frequency cod which is named as drive frequency, where the drive frequency can be the natural frequency of the spring mass system 10A, the governing equation for the rotational drive motion of the mass 30A can be given as:

$$\theta = |\theta|\sin(\omega_d t) \quad \text{(Eq-3)}$$

Then X-direction motion of the proof mass 30A at the drive frequency can be given as:

$$X_d \approx L|\theta|\sin(\omega_d t) \quad \text{(Eq-4)}$$

Y direction motion of the proof mass 30A can be represented by the following equation:

$$Y_d \approx L\frac{|\theta|^2 \sin^2(\omega_d t)}{2} = L|\theta|^2 \frac{1 - \cos(2\omega_d t)}{4} \quad \text{(Eq-5)}$$

As it can be seen in the equations 4 and 5, the Y direction motion of the mass 30A is at two times the drive frequency.

This behavior is due to the nonlinearity of the rotational movement of the proof mass 30A. If the mass is driven in the X direction with the use of a lever arm 20A at the drive frequency, there is always a Y direction vibration which is at two times the drive frequency, which is referred to as $2^{nd}$ Harmonic vibration.

The $2^{nd}$ Harmonic vibration can be non-ideal for MEMS sensors that are driven in one direction and the sensing motion is in-plane and orthogonal to the drive direction. As an example, if the X direction is the drive direction and the sensing direction is the Y direction, an erroneous signal in Y direction with a frequency that is two times the drive frequency is generated by the nonlinear motion of the lever arms. So, for those cases, it is needed to eliminate the Y direction component of the nonlinear motion by the use of specific structures and elements which may be added to the spring-mass system 10A. To describe the issues with a guided mass configuration 10, refer now to the following discussion in conjunction with the accompanying figures.

Figure 2A:
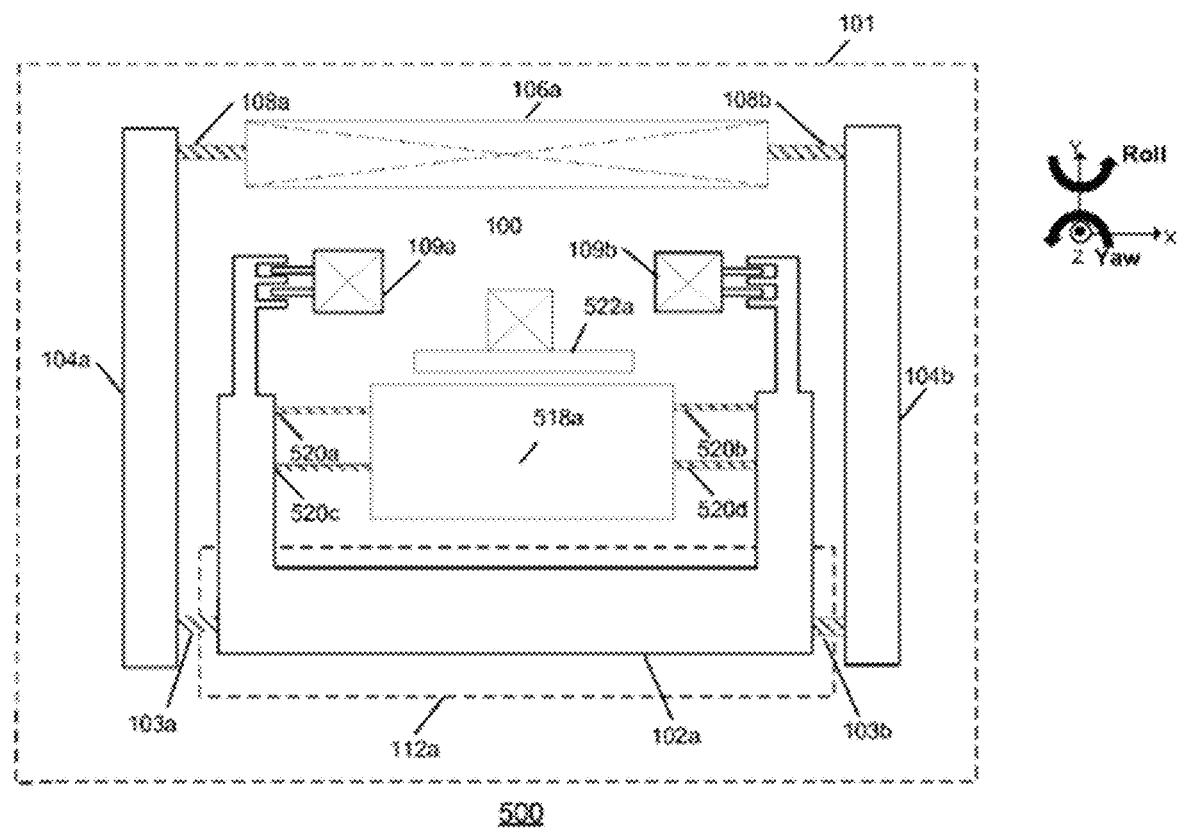
FIGS. 2A and 2B illustrate an embodiment of a single axis gyroscope comprising a guided mass system.

FIG. 2A illustrates an embodiment of a single axis gyroscope comprising a guided mass system 500. The guided mass system 500 is disposed in an X-Y plane parallel to a substrate 101 and comprises a guided mass system 100 coupled to a yaw proof mass 518a. The guided mass system 100 includes guiding arms 104a and 104b that are flexibly coupled via springs 108a and 108b to the substrate 101 via at least one anchoring point 106a. The two guiding arms 104a and 104b are flexibly coupled to one proof-mass 102a via springs 103a and 103b. The yaw proof mass 518a is flexibly connected to the proof mass 102a via yaw-springs 520a-520d.

Figure 2B:
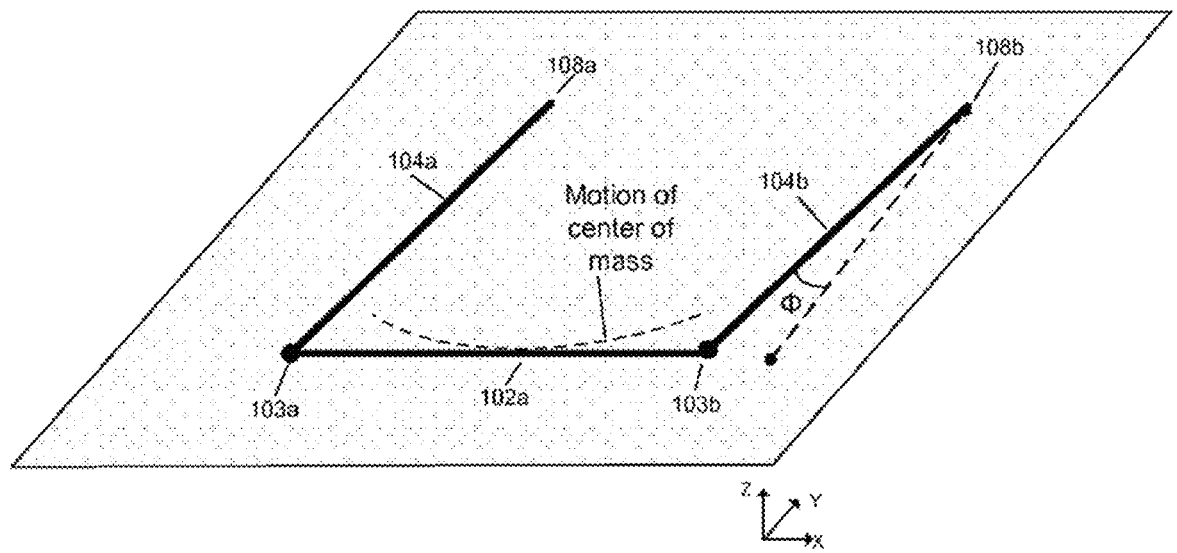

The proof mass 102a and yaw proof mass 518a, guiding arms 104a and 104b, anchoring point 106a, and springs 103a, 103b, 108a, and 108b form a planar four-bar linkage. The springs 103a, 103b, 108a, and 108b are compliant in-plane about an axis in the Z-direction so that each guiding arm 104a and 104b can rotate in-plane while the proof-mass 102a translates in an X-direction, as shown in FIG. 2B. Yaw-springs 520a-520d are stiff in the X-direction such that when the guided mass system 100 translates in the X-direction, the yaw proof-mass 518a also translates with the proof mass 102a.

Electrostatic actuators, such as comb drives 109a and 109b, are connected to the proof mass 102a to drive the guided mass system 100. In this embodiment, two electrostatic actuators are utilized.

However, one of ordinary skill in the art readily recognizes that one electrostatic actuator can be provided and the use of one electrostatic actuator would be within the spirit and scope of the present invention. In addition, although electrostatic actuators will be described throughout this specification as the actuators being used to drive the guided mass systems, one of ordinary skill in the art recognizes that a variety of actuators could be utilized for this function and that use would be within the spirit and scope of the present invention. For example, the actuators could be piezoelectric, thermal or electromagnetic or the like.

The guided mass system 500 can be driven at a drive frequency by a single drive circuit coupled to the actuators 109a and 109b. The drive frequency can be a resonant frequency of the guided mass system 500. When the guided mass system 500 is driven, the guiding arms 104a and 104b rotate in-plane and the proof-mass 102a and yaw proof mass 518a translate in-plane in the X-direction.

Angular velocity about a yaw-input axis in the Z-direction will cause a Coriolis force to act on the yaw proof-mass 518a in the Y-direction resulting in motion of the yaw proof-mass 518a in the Y-direction. A capacitive electrode 522a is used to sense the motion of the yaw proof-mass 518a in the Y-direction which provides a measure of the angular velocity about the yaw-input axis.

A variety of types of transducers could be utilized in a system and method in accordance with the present invention. For example, instead of using the capacitive electrode 522a, one can also use a piezoelectric or optical or the like transducer and its use would be within the spirit and scope of the present invention.

The guided mass system 500 can be simply represented by the spring mass system 10A that is shown in FIG. 1. The lever arms 104a-104b are similar to the lever arm 20A, the springs 103a-103b, 108a-108b and 520a-520d of the guided mass system 500 are compliant in the Y direction. As a result, the spring 40A can be a representation of y direction compliance of the springs 103a-103b, 108a-108b and 520a-520d. The proof mass 102a and the yaw proof-mass 518a are attached to the springs 103a-103b and 520a-520d, respectively, as the proof mass 30A is attached to the spring 40A. Finally, in-plane rotational compliance of the springs 108a-108b that are attached to the anchor 106a can be represented by the hinge 50A and the stable point 60A.

As it is shown in FIG. 2B, the motion of the center of mass of proof mass 102a has a non-linear motion. When the proof mass 102a and yaw proof-mass 518a are driven in the X direction, there is also a motion in Y direction that is at two times the drive frequency which is due to the nonlinearity of the drive motion as it has been explained in FIG. 1 for the spring-mass configuration 10. The motion at two times the drive frequency can also be called the $2^{nd}$ harmonic motion of the guided mass system 500. In the single axis gyroscope shown in FIG. 2A, the $2^{nd}$ Harmonic motion is sensed by the capacitive electrode 522a as an erroneous signal and it may corrupt the readings or saturate the front end electronics.

In certain conditions, guided mass system 500 can also be used as a dual axis gyroscope. If the springs 108a and 108b are compliant about a first roll-sense axis in the X-direction then the guiding arms 104a and 104b can rotate out-of-plane, whereby out-of-plane rotation of the guiding arms 104a and 104b causes the proof mass 102a and the yaw proof mass 518a move out-of-plane with the guiding arms 104a and 104b.

While the guided mass system 500 is driven, an angular velocity about a roll-input axis in the Y-direction that is in the plane of the substrate and orthogonal to the X-direction will cause a Coriolis force to act on the proof-mass 102a and the yaw proof-mass 518a in the Z-direction. The Coriolis force causes the guided mass system 500 to rotate out-of-plane about the first roll-sense axis. When the guided mass system 500 rotates out-of-plane, the guiding arms 104a and 104b and the proof mass 102a and yaw proof mass 518a rotate out-of-plane about the first roll-sense axis. The amplitude of the rotation of the guided mass system 500 is proportional to the angular velocity about the roll-input axis.

A capacitive electrode 112a under the proof mass 102a is used to detect the rotation of the guided mass system 500 about the first roll-sense axis. The rotation provides a measure of the angular velocity about the roll-input axis. A variety of types of transducers could be utilized in the present invention. For example, the capacitive electrode 112a could be also piezoelectric or optical or the like and its use would be within the spirit and scope of the present invention.

The guided mass system 500 of FIG. 2A can be modified to eliminate the $2^{nd}$ harmonic motion by using the methods that are introduced in one or more of the spring mass configurations 11, 12 and 13 shown in FIG. 1. To describe these configurations and methods in more detail refer now to the following description in conjunction with the accompanying Figures.

A second spring-mass configuration 11 is shown in FIG. 1 that has components similar to the spring-mass configuration 10. Spring mass configuration 11 includes two spring mass systems 11A-11B. Each of the two spring mass systems 11A-11B comprise lever arms 21A-21B, and a traveling system 101A comprising traveling masses 31A-31B and connection element 21, linear springs 41A-41B, hinges 51A-51B attached to stable points 61A-61B.

The difference between spring-mass configuration 11 and the spring mass configuration 10 is connection element 21 that connects two spring-mass systems 11A and 11B. In the spring-mass configuration 11, while two spring-mass systems 11A-11B are operated side by side, they are also connected by the connection element 21. Both 11A and 11B move in the same X direction during the drive operation. But, the Y direction motion of 11A and 11B are opposing each other. If those two spring-mass systems 11A-11B are rigidly connected by the connection element 21, then the spring elements 41A and 41B stretches in opposite directions to accommodate the nonlinear motion due to the rotation of the lever arms 21A and 21B. As a result of the compensation of the $2^{nd}$ harmonic motion by the spring elements 41A and 41B, the net motion on the traveling masses 31A and 31B in Y direction becomes zero. Consequently, the traveling masses 31A and 31B can be restricted to move only in the x direction by eliminating the unwanted $2^{nd}$ harmonic Y direction motion.

Spring mass configuration 12 includes two spring mass systems 12A-12B which comprise lever arms 22A-22B, a traveling system 101B comprising traveling masses 32A-32B and spring element 22, linear springs 42A-42B, and hinges 52A-52B attached to stable points 62A-62B. In contrast to spring mass configuration element 10, the springs 42A and 42B have different spring stiffness values. Moreover, an additional component of spring-mass configuration 12 compared to spring mass configuration 10 is the spring element 22 coupled between traveling masses 32A and 32B. Spring element 22 is used to eliminate the unwanted $2^{nd}$ harmonic Y direction motion of the traveling masses 32A or 32B. Compliance of the spring 22 can be designed such a way that the 2nd harmonic motion of one of the spring-mass system 12B can be used to compensate for the $2^{nd}$ harmonic motion of the other spring-mass system 12A, or vice versa. For example, by ensuring that the spring stiffness the spring 42B is equal to the combined stiffness of the spring 22 and the spring 42A, the $2^{nd}$ harmonic motion of the traveling mass 32A can be eliminated due to the balance of the opposing forces as in the spring mass configuration 11. In this scenario, traveling mass 32B would still have an unwanted $2^{nd}$ harmonic motion.

A third modification to the spring-mass configuration 10 is shown as the spring-mass configuration 13. Spring mass configuration 13 includes two spring-mass systems 13A-13B which are composed of lever arms 23A-23B, and a traveling system 1010 comprising traveling masses 33A-33B, spring element 23, transducers 73A-73B and 74A-74B, linear springs 43A-43B, and hinges 53A-53B attached to stable points 63A-63B.

The additional components of spring-mass configuration 13 compared to spring mass configuration 10 are spring element 23 and transducers 73A-73B and 74A-74B. By coupling two spring mass systems 13A and 13B, both of the traveling masses 33A and 33B can be resonated in the drive direction at a natural drive frequency. Furthermore, by coupling the traveling masses 33A and 33B using the spring 23, the proof masses 33A and 33B can also resonate in the Y direction at another natural frequency. Transducers 73A-73B and 74A-74B are used to sense the motion of the traveling masses 33A-33B in Y direction. Transducers in an embodiment could be capacitive, piezoresistive or the like, although one of ordinary skill in the art readily recognizes that the transducers could a variety of types and that would be within the spirit and scope of the present invention.

The sensing direction of the transducers 73A-73B and 74A-74B can be selected such a way that the $2^{nd}$ harmonic component of the drive motion in Y direction can be rejected, but the signals that are useful can be preserved. As an example, in the spring-mass configuration 13, if it is assumed that the common mode motion in the Y direction is the sensor response, as in the case of a yaw gyroscope undergoing Z-axis rotation, the Y direction $2^{nd}$ harmonic motion is rejected since the electrodes cancels the opposing (differential) motions in Y direction.

The spring-mass configuration 13 is given as an example for the electrical cancellation of unwanted $2^{nd}$ Harmonic motion in Y direction; however, there may be different sensing and rejection schemes of transducers, depending on the proof mass and electrode configurations. In other configurations, the common mode motion can be rejected but the differential motion can be detected.

The following description will describe different guided mass systems that incorporate on or more of the spring mass configurations 11-14 described above.

Figure 3:
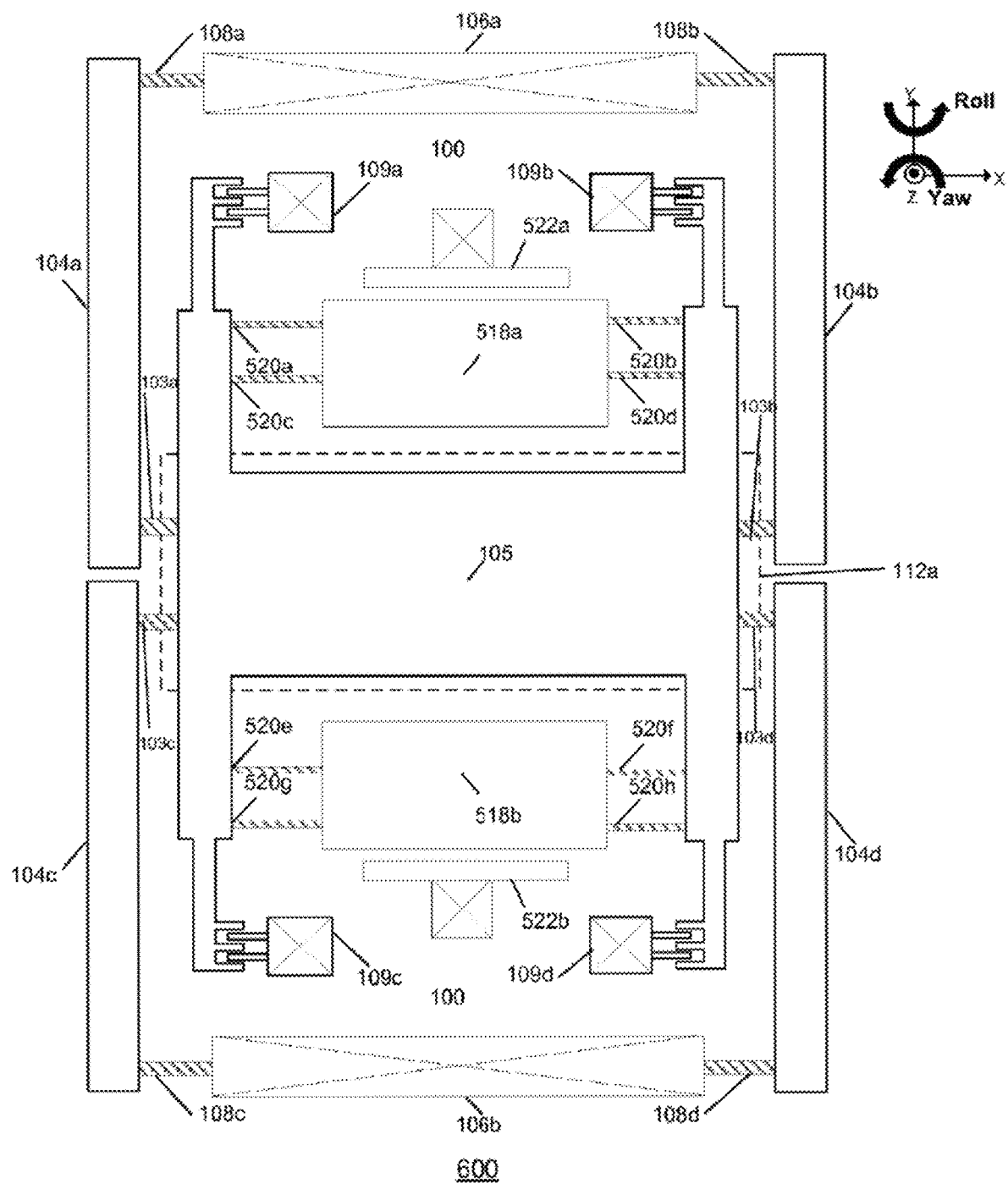
FIG. 3 illustrates an embodiment of a single axis gyroscope comprising a guided mass system in accordance with the present invention.

FIG. 3 illustrates an embodiment of a single axis gyroscope comprising a guided mass system in accordance with the present invention. The guided mass system 600 is disposed in an X-Y plane. The guided mass system 600 includes guiding arms 104a, 104b, 104c and 104d that are flexibly coupled via springs 108a, 108b, 108c and 108d to the substrate 100 via the anchoring points 106a and 106b. Four guiding arms 104a, 104b, 104c and 104d are flexibly coupled to one traveling mass 105 via springs 103a, 103b, 103c and 103d.

Each spring 103a-103d, 108a-108d is compliant in-plane about an axis in the Z-direction so that each guiding arm 104a-104b and 104c-104d can rotate anti-phase in the plane while the traveling mass 105 translates in an X-direction. The yaw proof-masses 518a and 518b are flexibly connected to the traveling mass 105 via yaw-springs 520a-520d and 520e-520h, respectively. The guided mass system 600 can be driven at a drive frequency by a single drive circuit coupled to the actuators 109a-109d. The drive frequency can be a resonant frequency of the guided mass system 600. When the guided mass system 600 is driven, the guiding arms 104a-104b and 104c-104d rotate anti-phase in-plane and the traveling-mass 105 translates in-plane in the X-direction. Yaw-springs 520a-520d and 520e-520h are stiff in the X-direction such that when the guided mass system is driven, the yaw proof-masses 518a-b also translate with the traveling mass 105 in the X-direction.

Angular velocity about a yaw-input axis in the Z-direction will cause a Coriolis force to act on the yaw proof-masses 518a-518b in the Y-direction resulting in a common mode motion of the yaw proof-masses 518a and 518b. The capacitive electrodes 522a and 522b are used to sense the motion of the yaw proof-masses 518a and 518b in the Y-direction which provides a measure of the angular velocity about the yaw-input axis.

The configuration shown in FIG. 3 can be represented as the spring mass configuration 11 of FIG. 1. As in the spring mass configuration 11, guided mass system 600 eliminates the second harmonic motion by combining two guided mass systems by a rigid traveling mass 105. Since the motion of the lever arms 104a-104b and 104c-104d are anti-phase with respect to each other, the travelling mass 105 that is connected to the lever arms 104a-104d balances the opposing $2^{nd}$ harmonic motion and eliminates the unwanted non-linear component of the drive motion, and the y direction compliance of the spring elements 108a-108b, 103a-103b and 108c-108d, 103c-103d accommodates the $2^{nd}$ Harmonic motion by stretching in y direction similar to the spring mass configuration 12.

In certain conditions, guided mass system 500 can also be used as a dual axis gyroscope. If we assume that the springs 108a-108b and 108c-108d are compliant about a first and second roll-sense axis, respectively, where the first and second roll sense axes are parallel to each other and they are in the X-direction, then the guiding arms 104a-104b and 104c-104d can rotate anti-phase out-of-plane, whereby out-of-plane rotation of the guiding arms 104a-104d causes the traveling mass 105 to move out-of-plane with the guiding arms 104a-104d.

Angular velocity about a roll-input axis in the Y-direction that is in the plane of the substrate and orthogonal to the X-direction will cause a Coriolis force to act on the traveling mass 105 in the Z-direction. The Coriolis force causes the lever arms 104a-104b and lever arms 104c-104d rotate anti-phase out-of-plane about the first and second roll-sense axes and the traveling mass 105 moves in the Z direction. The amplitude of the motion of the roll-travelling mass 105 is proportional to the angular velocity about the roll-input axis. A capacitive electrode 112a under the traveling mass 105 is used to detect the motion of the proof-mass. This motion provides a measure of the angular velocity about the roll-input axis.

Figure 4:
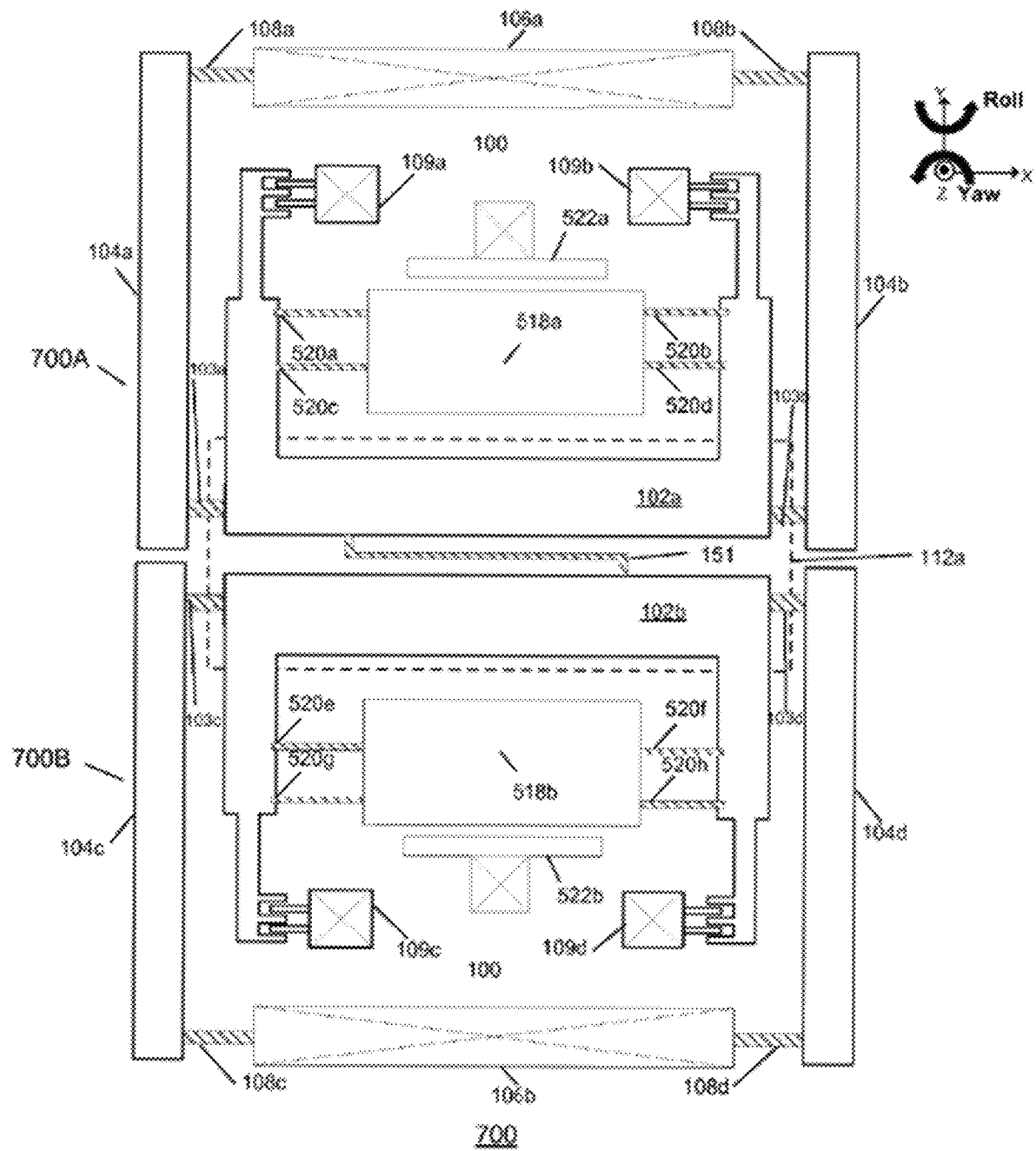
FIG. 4 shows a modification of a guided mass system to eliminate the 2nd harmonic component of the drive motion.

FIG. 4 illustrates a second embodiment of a single axis gyroscope comprising a guided mass system 700 in accordance with the present invention which minimizes a 2nd Harmonic component of the drive motion.

The guided mass system 700 comprises two guided mass systems 700A and 700B, which are same as the guided mass system 500. The proof masses 102a and 102b, consequently two guided mass systems 700A and 700B, are connected by a coupling spring 151. The yaw proof-masses 518a and 518b are flexibly connected to the proof-masses 102a and 102b, respectively. The coupling spring 151 is torsionally compliant about an axis in the X-direction so that the symmetric guided mass systems 700A and 700B can rotate anti-phase out-of-plane about the first and second roll-sense axes. The coupling spring 151 is stiff in the Z-direction which prevents the guided mass systems 700A and 700B from rotating in-phase out-of-plane.

The coupling spring 151 is stiff in the X-direction such that the proof-mass 102a and 102b move together in the X-direction. In this way the two guided mass systems 700A and 700B are driven together at a drive frequency by a single drive circuit coupled to the actuators 109a-109d.

The configuration given in FIG. 4 can be represented by the spring mass configuration 13 given in FIG. 1. As in the spring mass configuration 13, two guided mass systems 700A and 700B are connected by a coupling spring 151, so that the proof masses 102a-102b and 518a-518b can also resonate in the Y direction at a certain natural frequency. Capacitive electrodes 522a and 522b are used to sense the motion of the proof-masses 518a and 518b in Y direction, respectively. The sensitive direction of the capacitive electrodes 522a-522b can be selected such a way that the $2^{nd}$ harmonic motion in the Y direction is rejected but the Coriolis motion in the Y direction is detected.

In the guided mass system 700, the proof masses 518a and 518b move in the same direction in the drive motion. Hence, an angular velocity about a yaw-input axis in the Z-direction will impart a Coriolis force on the yaw proof-masses 518a-b in the same Y-direction (common mode motion).

Due to the placement of the electrodes 522a and 522b in the guided mass system 700, the capacitance of the electrodes 522a and 522b changes in opposite directions while the proof masses 518a-518b move in the same direction.

If the capacitance change on the electrodes is subtracted from each other, the common mode Coriolis response of the proof masses 518a and 518b is able to be detected.

On the other hand, the $2^{nd}$ harmonic motions of the proof masses 518a-518b in the Y direction are in opposite directions, because the guiding arms 104a-104b and 104c-104d are rotating around opposite directions. Consequently, the $2^{nd}$ harmonic motion of the proof masses 518a-518b will be cancelled due to the configuration of the electrodes 522a-522b.

Figure 5:
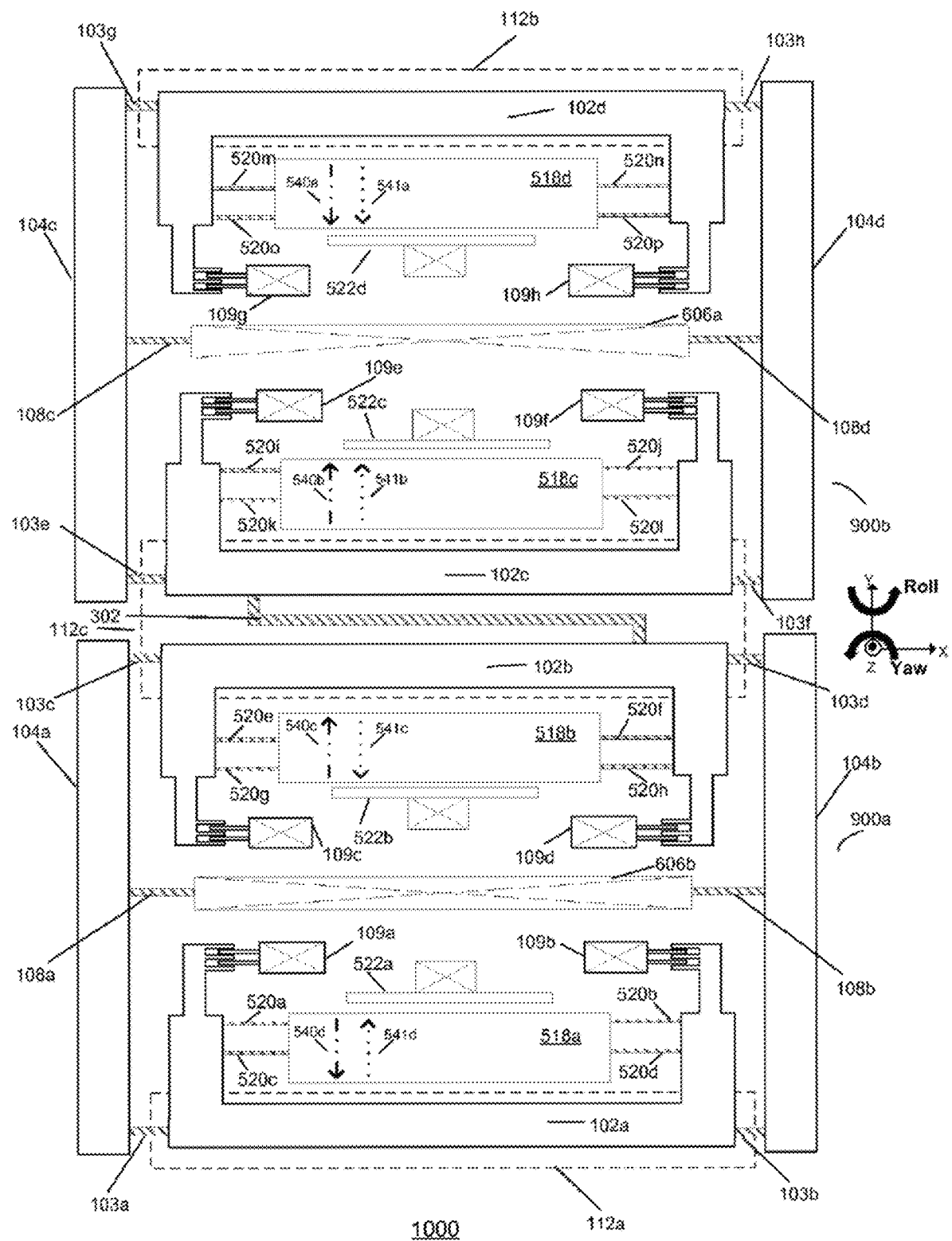
FIG. 5 illustrates another embodiment of a single axis gyroscope comprising a balanced guided mass system in accordance with an embodiment of the present invention.

FIG. 5 illustrates another embodiment of a single axis gyroscope comprising a balanced guided mass system 1000 in accordance with an embodiment of the present invention. The guided mass system 1000 includes two symmetric guided mass systems 900a and 900b which are connected by a coupling spring 302. However, the coupling between the guided mass systems 900a and 900b doesn't have to be only a single coupling spring 302; the coupling may include various springs and spring-mass systems.

The two symmetric guided mass systems 900a and 900b are arranged so that the proof-masses 102a-102d all move in the X-direction. Hence, the two guided mass systems 900a and 900b are driven together at a drive frequency by a single drive circuit coupled to the actuators 109a-109h.

In the drive motion of the guided mass system 1000, the proof-masses 102b and 102c move together in the same X-direction, since the coupling spring 302 is stiff in the X-direction. On the other hand, the proof masses 102a and 102d move in the opposite X-direction compared to the proof masses 102b and 102c.

Angular velocity about the yaw-input axis will cause Coriolis forces to act on the yaw proof-masses 518a-518d resulting in motion of the yaw proof-masses 518a-518d along the Y-direction. The amplitude of the motions of the yaw proof-masses 518a-518d is proportional to the angular velocity about the yaw-input axis.

The schematic provided in FIG. 5 is a different embodiment of the spring-mass configuration 13 shown in FIG. 1. The balanced guided mass system 1000 eliminates the unwanted 2nd harmonic motion of the yaw proof masses 518a-518d by electrical cancellation.

Due to the nature of the drive motion explained above, the imparted Coriolis forces on the proof masses 518a and 518d are in the opposite direction of the imparted Coriolis forces on the proof masses 518a and 518d. In other words, the Coriolis response motion of the proof masses 518b and 518c vs. the proof masses 518a and 518d are differential. In order to detect the differential motion effectively within the given electrode placements in FIG. 5, the capacitance change of the electrodes 522a and 522b due to the Coriolis motion of the proof masses 518a-518b can be summed up. The capacitance change of the electrodes 522c and 522d can also be summed up. Moreover, the detected capacitance change from the electrode pair 522c-522d can be subtracted from the detected capacitance change of the electrode pair 522a-522b. As a result of the electrode configuration, the Coriolis motion is detected.

The 2nd harmonic motion direction of the each proof mass 518a-518d is illustrated by the arrows 541a-541d which are shown side by side by the arrows 540a-540d that are showing the Coriolis force direction of the proof masses 518a-518d. The given arrow configuration shows that the Coriolis force and the 2nd harmonic motion are in the same direction for the guided mass system 900b but they are in the opposite directions for the guided mass system 900a. As a result, the 2nd harmonic motion will be cancelled due to the electrode scheme given above.

The balanced guided mass system 1000 can also be used as a dual axis gyroscope with a condition where the symmetric guided mass system 900a is able to rotate out-of-plane about a first roll-sense axis and the symmetric guided mass system 900b is able to rotate out-of-plane about a second roll-sense axis in-plane and parallel to the first roll-sense axis.

The coupling spring 302 is connected to proof-masses 102b and 102c. The coupling spring 302 is torsionally compliant about an axis in the X-direction so that the symmetric guided mass systems 900a and 900b can rotate anti-phase out-of-plane about the first and second roll-sense axes. The coupling spring 302 is stiff in the Z-direction which prevents the symmetric guided mass systems 900a and 900b from rotating in-phase out-of-plane.

Angular velocity about the roll-input axis will cause Coriolis forces to act on the proof-masses 102a-102d in the Z-direction. The Coriolis forces cause the symmetric guided mass systems 900a and 900b to rotate anti-phase out-of-plane about the first and second roll-sense axes. The amplitudes of the rotations of the symmetric guided mass systems 900a and 900b are proportional to the angular velocity. Capacitive electrodes 112a-112c under the proof masses 102a-102d are used to detect the rotations of the symmetric guided mass systems 900a and 900b.

Figure 6A:
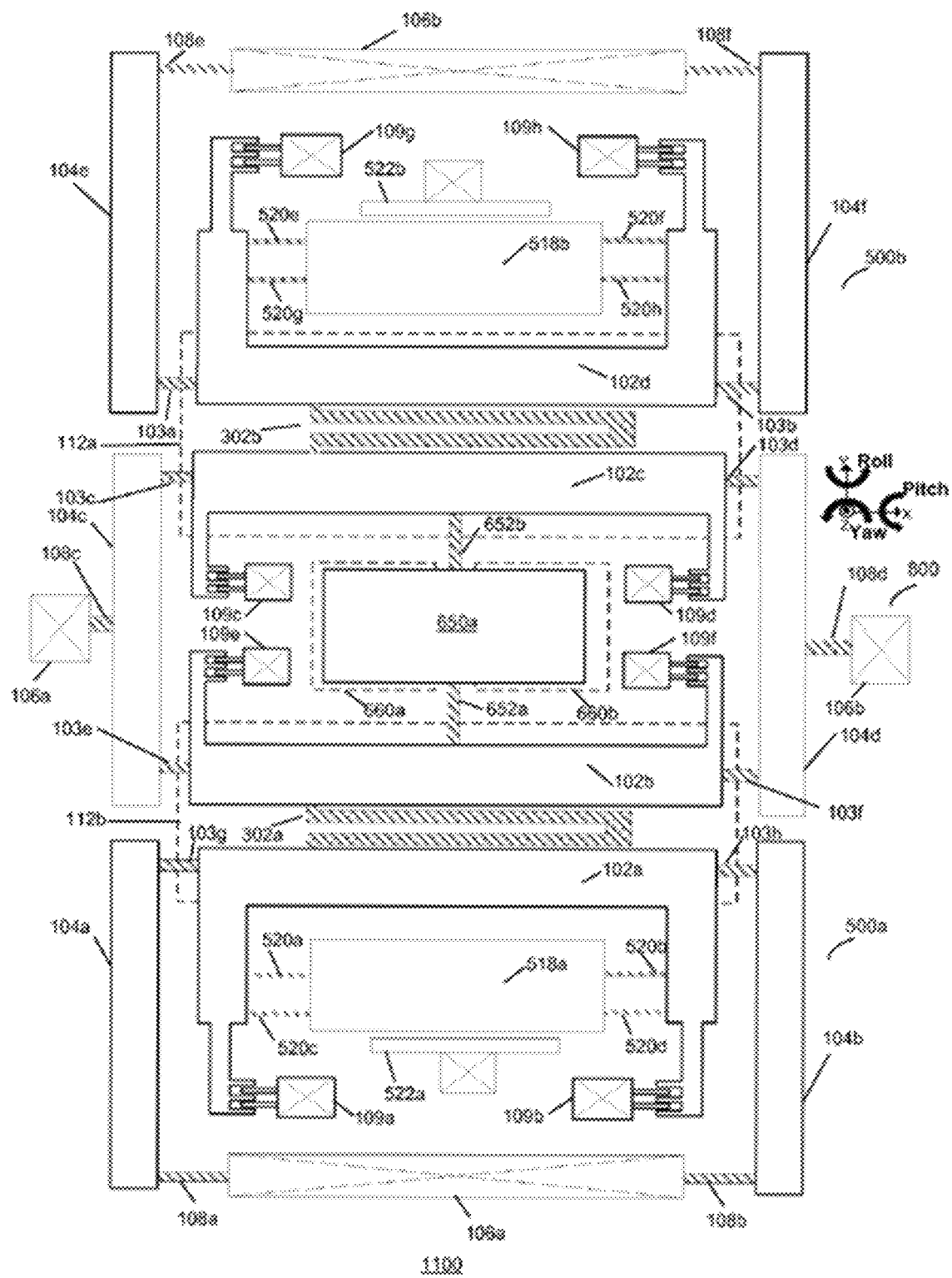
FIGS. 6a and 6b illustrates an embodiment of a tri-axis gyroscope comprising a multiple guided mass system in accordance with the present invention.

FIG. 6a illustrates an embodiment of a tri-axis gyroscope comprising a multiple guided mass system 1100 in accordance with the present invention. The multiple guided mass system 1100 includes two guided mass systems 500a and 500b coupled to a guided mass system 800 by coupling springs 302a and 302b, respectively.

The guided mass systems 500a, 500b and 800 are arranged so that yaw proof-masses 518a and 518b coupled to roll proof masses 102a-102d all move anti-phase in the X-direction, the pitch proof-mass 650a rotates about an axis in the Z-direction. The guided mass system 500a rotates out-of-plane about a first roll-sense axis. The symmetric guided mass system 800 rotates out-of-plane about a second roll-sense axis parallel to the first roll-sense axis. The guided mass system 500b rotates out-of-plane about a third roll-sense axis parallel to the first and second roll-sense axes. The first coupling spring 302a is connected to proof-masses 102a and 102b. The coupling spring 302a is stiff in the X-direction such that proof-mass 102a and 102b move together in the X-direction. The second coupling spring 302b is connected to proof-masses 102c and 102d. The coupling spring 302b is stiff in the X-direction such that proof-mass 102c and 102d move together in the X-direction. In this way the guided mass systems 500a, 500b, and 800 are driven together at a drive frequency by a single drive circuit coupled to the actuators 109a-109h. Moreover, as it can be seen in FIG. 6a, folded flexures are used as coupling springs 302a-b.

The coupling spring 302a is torsionally compliant about an axis in the X-direction so that the guided mass systems 500a and 800 can rotate out-of-plane about the first and second roll-sense axes anti-phase. The coupling spring 302a prevents the symmetric guided mass systems 500a and 800 from rotating out-of-plane in-phase.

The coupling spring 302b is also torsionally compliant about an axis in the X-direction so that the guided mass systems 500b and 800 can rotate out-of-plane about the second and third roll-sense axes anti-phase. The coupling spring 302b prevents the symmetric guided mass systems 500b and 800 from rotating out-of-plane in-phase.

Angular velocity about the pitch-input axis will cause Coriolis forces to act on the pitch proof-mass 650a resulting in a torque that rotates the pitch proof-mass 650a about the pitch-sense axis. The amplitude of the rotation of the pitch proof-mass 650a is proportional to the angular velocity about the pitch-input axis. The capacitive electrodes 660a and 660b are disposed on opposite sides along the X-direction under the pitch proof-mass 650a and detect the rotation of the pitch proof-mass about the pitch-sense axis. The rotation provides a measure of the angular velocity about the pitch-input axis.

Angular velocity about the roll-input axis will cause Coriolis forces to act on the proof-masses 102a and 102b in a Z-direction and on proof-masses 102c and 102d in the opposite Z-direction. The Coriolis forces cause the guided mass systems 500a, 800, and 500b to rotate out-of-plane about the first, second, and third roll-sense axis respectively. The capacitive electrode 112b under the proof masses 102a and 102b and the capacitive electrode 112a under the proof masses 102c and 102d are used to detect the rotation of the guided mass system 1100. This rotation provides a measure of the angular velocity about the roll-input axis.

Angular velocity about the yaw-input axis will cause Coriolis forces to act on the yaw proof-masses 518a and 518b resulting in motion of the yaw proof-masses 518a and 518b anti-phase along the Y-direction. The amplitude of the motion of the yaw proof-masses along the Y-direction is proportional to the angular velocity. The capacitive electrodes 522a and 522b are used to sense the motion of the respective yaw proof masses 518a and 518b along the Y-direction.

The multiple guided mass system 1100 of FIG. 6a can be represented by the spring mass configuration 12 shown in FIG. 1. The spring-mass system 12A is a representation of one of the guided mass systems 500a or 500b, and the spring-mass system 12B is a representation of the guided mass system 800.

The springs 103c-103f and 108c-108d are compliant in y direction and their compliance can be modeled by an equivalent spring as 42B, which is given in spring mass system configuration 12 in FIG. 1. In the guided mass system 500a, the springs 108a-108b, 103g-103h and 520a-520d can be modeled by the spring 42A. The coupling spring 302a that connects 500a and 800 can be modeled as spring 22. The lever arms 104c-104d can be modeled as the lever arm 22B, and the lever arms 104a-104b can be represented as 22A.

Y direction spring stiffness of the guided mass system 800 is much higher than the y direction spring stiffness of the guided mass system 500a or 500b. The reason is that the springs sets 103c-103d and 103e-103f have been equally spread in the guided mass system 800, and also the springs 652a and 652b are very stiff in Y direction.

By using the same 2nd harmonic motion elimination illustrated by spring-mass configuration 12 of FIG. 1, the y direction spring stiffness of the springs 103c-103f, 108c-108d, and 652a-652b can be made equal to the sum of the spring stiffness of the coupling spring 302a and the springs 108a-108b, 103g-103h and 520a-520d. As a result, the net nonlinear motion in y direction of the yaw-proof masses 518a-518b can be eliminated by the help of the balance of the opposing forces in y direction. As it was mentioned before a folded flexure is used as coupling spring 302a. The main benefit of using a folded flexure is to increase the y direction translational stiffness of coupling spring 302a, while maintaining its out-of plane torsional compliance within the given area. Although, a two-fold folded flexure is used in embodiment 1100, folded flexure with many folds can also be used to increase the y direction translational stiffness.

Figure 6B:
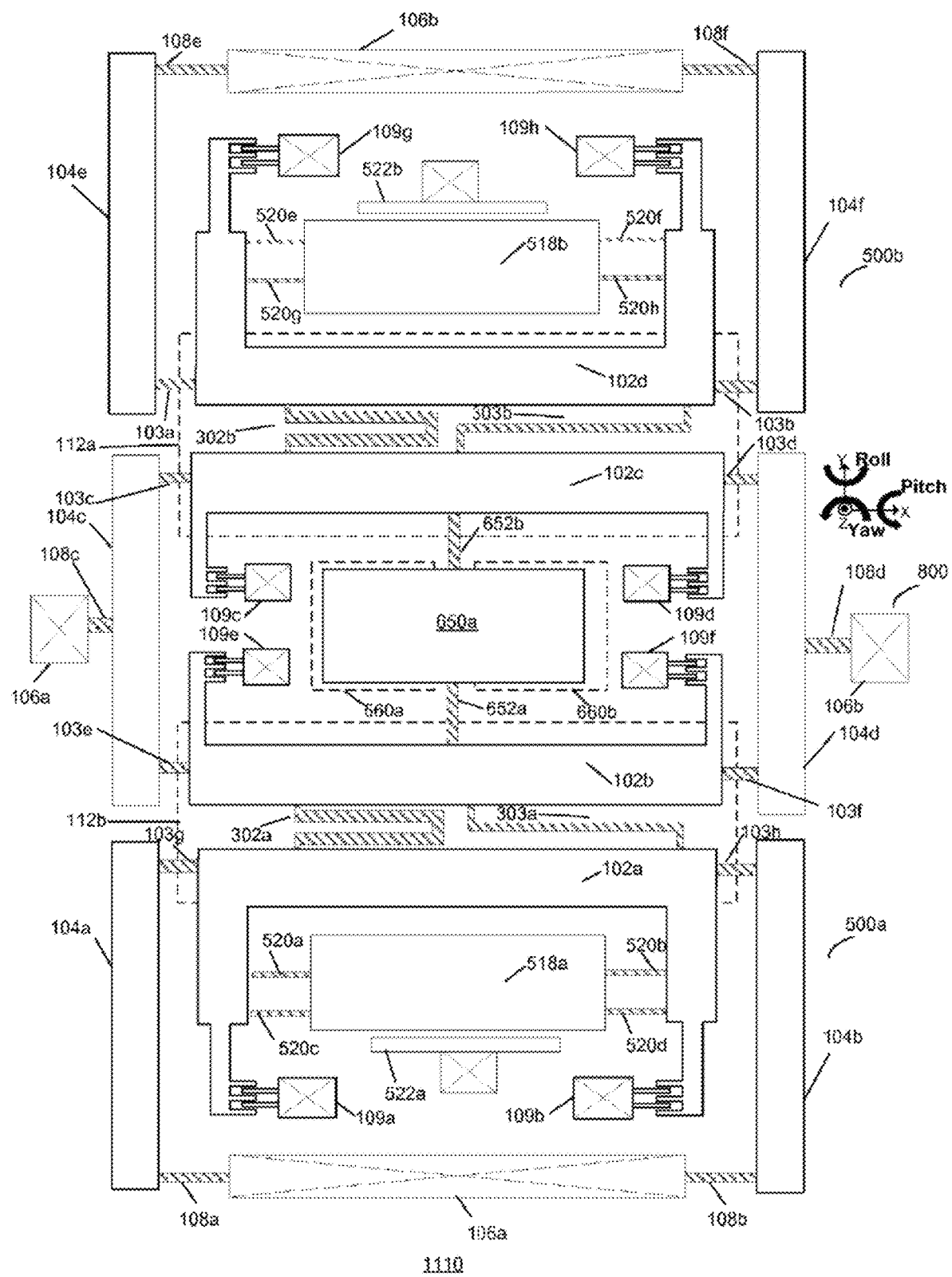

FIG. 6b illustrates another embodiment of a tri-axis gyroscope comprising a multiple guided mass system 1110 in accordance with the present invention. Multiple guided mass system is same as multiple guided mass system 1100, except new coupling springs 303a and 303b are added in between proof masses 102a-b and 102c-d respectively. Main benefit of adding springs 303a and 303b in multiple guided system 1110 is to increase the y direction translational stiffness. Moreover, springs 303a-b improves x direction stiffness. As a result, rigidity of multiple guided mass system 1110 during the drive motion increases and proof masses 102a-b and 102c-d move together in the x direction.

Embodiments for modifying a spring mass configuration are disclosed that minimize the effects of unwanted nonlinear motion on a MEMS sensor. The modifications include any or any combination of providing a rigid element between rotating structures of the spring mass configuration, tuning a spring system between the rotating structures and coupling an electrical cancellation system to the rotating structures. In so doing unwanted nonlinear motion such as unwanted $2^{nd}$ harmonic motion is minimized.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A Micro-Electro-Mechanical Systems (MEMS) sensor comprising;
   first and second rotating arms, wherein the first and second rotating arms are coupled to each other and the first and second rotating arms are configured to counter rotate when driven into oscillation in a first direction, wherein the first rotating arm is coupled to a first anchor on a substrate by a first flexible element, wherein the second rotating arm is coupled to a second anchor on the substrate by a second flexible element;
   at least one travelling system comprising at least a first travelling mass and a second travelling mass and at least one proof mass,
   wherein the first travelling mass is coupled to the first rotating arm by a third flexible element and the second travelling mass is coupled to the second rotating arm by a fourth flexible element,
   wherein the at least the first travelling mass and the second travelling mass are coupled to each other by a fifth flexible element, wherein the fifth flexible element is compliant in a direction orthogonal to the first direction, wherein the second travelling mass is coupled to the at least one proof mass, wherein the first travelling mass moves in a non-linear motion orthogonal to the first direction and the at least one proof mass and the second travelling mass move in a linear translation in the first direction, when driven into oscillation; and at least one actuator for driving the at least one travelling system into oscillation.

2. The MEMS sensor of claim 1, wherein the at least one proof mass and the second travelling mass move in a plane parallel to the substrate.

3. The MEMS sensor of claim 1, wherein the first and second rotating arms are coupled to an anchor system, comprising the first anchor and the second anchor, on the substrate, by a set of flexible elements, wherein the set of flexible elements comprise at least the first, the second, the third, the fourth, and the fifth flexible elements, and wherein the set of flexible elements are balanced to minimize transmission of the non-linear motion orthogonal to the first direction to the at least one proof mass and the second travelling mass.

4. The MEMS sensor of claim 1, wherein a first subset comprising the first, the third, and the fifth flexible elements and a second subset comprising the second and the fourth flexible elements are balanced with respect to forces in the direction orthogonal to the first direction.

5. The MEMS sensor of claim 1, further comprising:

a plurality of transducers configured to sense motions of at least a portion of at least one of the at least one proof mass, the first travelling mass, or the second travelling mass.

6. The MEMS sensor of claim 5, wherein at least a portion of the at least one travelling system is configured to allow an out-of-plane rotation of the at least the portion of the at least one travelling system about a roll axis that is in plane with and orthogonal to the first direction.

7. The MEMS sensor of claim 6, wherein the plurality of transducers are further configured to sense at least a portion of the out-of-plane rotation of the at least the portion of the at least one travelling system.

8. The MEMS sensor of claim 6, wherein the fifth flexible element system is configured to allow the out-of-plane rotation of the at least the portion of the at least one travelling system.

9. The MEMS sensor of claim 6, wherein the fifth flexible element system is torsionally compliant about an axis parallel to the first direction to allow the out-of-plane rotation of the at least the portion of the at least one travelling system to be anti-phase with the oscillation.

10. The MEMS sensor of claim 5, wherein the plurality of transducers comprises at least one of a capacitive transducer, an optical transducer, or a piezoelectric transducer.

11. The MEMS sensor of claim 1, wherein the first and second rotating arms are configured to allow rotation of the first and second rotating arms in plane with and orthogonal to the first direction.

12. The MEMS sensor of claim 1, wherein the fifth flexible element comprises a folded spring.

13. The MEMS sensor of claim 12, wherein the fifth flexible element comprises at least the folded spring and at least one of another folded spring, another proof mass, or a rigid coupling element.

14. The MEMS sensor of claim 1, wherein at least one of the first, the second, the third, the fourth, or the fifth flexible element comprises at least one folded flexure.

15. The MEMS sensor of claim 14, wherein the at least one of the first, the second, the third, the fourth, or the fifth flexible element comprises a plurality of springs comprising folded flexures.

* * * * *